US010788693B2

(12) United States Patent
Kwon et al.

(10) Patent No.: US 10,788,693 B2
(45) Date of Patent: Sep. 29, 2020

(54) FLEXIBLE DISPLAY DEVICE AND METHOD FOR MANUFACTURING THEREOF

(71) Applicant: LG Display Co., Ltd., Seoul (KR)

(72) Inventors: Hoiyong Kwon, Busan (KR); MiReum Lee, Gyeongsangnam-do (KR)

(73) Assignee: LG Display Co., Ltd, Seoul (KR)

( * ) Notice: Subject to any disclaimer, the term of this patent is extended or adjusted under 35 U.S.C. 154(b) by 646 days.

(21) Appl. No.: 14/983,811

(22) Filed: Dec. 30, 2015

(65) Prior Publication Data
US 2016/0323993 A1    Nov. 3, 2016

(30) Foreign Application Priority Data

Apr. 30, 2015 (KR) .......................... 10-2015-0061994

(51) Int. Cl.
*H05K 1/02* (2006.01)
*G02F 1/1333* (2006.01)
*G02F 1/1345* (2006.01)
*H01L 51/00* (2006.01)
*G06F 1/16* (2006.01)

(52) U.S. Cl.
CPC .... *G02F 1/133305* (2013.01); *G02F 1/13452* (2013.01); *G06F 1/1652* (2013.01); *H01L 51/0097* (2013.01); *Y02E 10/549* (2013.01); *Y02P 70/521* (2015.11)

(58) Field of Classification Search
CPC ........... G02F 1/133305; G02F 1/13452; H01L 51/0097; H01L 27/3244; H01L 51/003; H01L 51/524; H01L 51/56; G06F 1/1652; Y02E 10/549; Y02P 70/521
See application file for complete search history.

(56) References Cited

U.S. PATENT DOCUMENTS

| 6,273,791 | B1* | 8/2001 | Kataoka | ................ B24B 37/042 257/E21.237 |
| 2006/0288571 | A1 | 12/2006 | Seo et al. | |
| 2008/0132033 | A1* | 6/2008 | Eguchi | .............. H01L 21/67092 438/460 |
| 2011/0205722 | A1* | 8/2011 | Chen | ................. G02F 1/133305 361/807 |
| 2011/0261513 | A1* | 10/2011 | Tho | ....................... B29C 70/763 361/679.01 |

(Continued)

FOREIGN PATENT DOCUMENTS

| CN | 1885111 A | 12/2006 |
| CN | 104167429 A | 11/2014 |

(Continued)

OTHER PUBLICATIONS

First Notification of Office Action dated Jun. 1 2018, from the State Intellectual Property Office of China in corresponding application No. 201511036142.4.

*Primary Examiner* — Anthony J Frost
(74) *Attorney, Agent, or Firm* — Morgan, Lewis & Bockius LLP

(57) ABSTRACT

A flexible display device is disclosed. The flexible display device may include a flexible substrate, a display device layer on a first surface of the flexible substrate, a receiving groove in a second surface of the flexible substrate, and a deformation-preventing layer in the receiving groove on the second surface of the flexible substrate.

12 Claims, 6 Drawing Sheets

(56) References Cited

U.S. PATENT DOCUMENTS

| | | | |
|---|---|---|---|
| 2014/0140037 A1* | 5/2014 | Cho | ............................ F21V 9/14 |
| | | | 362/19 |
| 2014/0183473 A1* | 7/2014 | Lee | ..................... H01L 51/0097 |
| | | | 257/40 |
| 2015/0220118 A1 | 8/2015 | Kwak et al. | |
| 2016/0254329 A1 | 9/2016 | Hsieh et al. | |

FOREIGN PATENT DOCUMENTS

| | | |
|---|---|---|
| KR | 10-2009-0062078 A | 6/2009 |
| WO | 2014/021660 A2 | 2/2014 |

\* cited by examiner

FLEXIBLE DISPLAY DEVICE AND METHOD FOR MANUFACTURING THEREOF

CROSS REFERENCE TO RELATED APPLICATIONS

This application claims the benefit of the Korean Patent Application No. 10-2015-0061994 filed on Apr. 30, 2015, which is hereby incorporated by reference as if fully set forth herein.

BACKGROUND

1. Technical Field

The present invention relates to a display device and a method for manufacturing thereof, and more particularly, to a flexible display device and a method for manufacturing thereof.

2. Discussion of Related Art

A flexible display device may be typically realized by forming a pixel cell on a thin flexible substrate such as plastic. Thus, even though the flexible display device may rolled or wound in a paper-like fashion, an image may be displayed thereon. Owing to these advantages, flexible display devices have been steadily researched and developed as a next-generation display device.

The flexible display device may include a flexible liquid crystal display device, a flexible plasma display device, a flexible organic light emitting display device, a flexible electrophoretic display device, a flexible electro-wetting display device, etc.

Among the above flexible display devices, the organic light emitting display device has attracted much attention as a next-generation display device, owing at least to advantages of rapid response time (e.g., 1 ms or less), low power consumption, and self light emission.

Hereinafter, a related art flexible display device will be described with reference to the accompanying drawings.

FIGS. 1A and 1B are cross sectional views illustrating the related art flexible display device.

With reference to FIGS. 1A and 1B, the related art flexible display device may include a base substrate 1, a flexible substrate 2, a display device layer 3, and an encapsulation layer 4.

The flexible substrate 2 may be a thin substrate of plastic. This flexible substrate 2 may be too thin to bear a process of depositing the display device layer 3 and the encapsulation layer 4 during manufacturing. For this reason, the base substrate 1, which is formed of a solid material capable of supporting the flexible substrate 2, is attached to one surface of the flexible substrate 2, and then the display device layer 3 and the encapsulation layer 4 are formed on the other surface of the flexible substrate 2 for the manufacturing process.

Then, as shown in the flexible display device of FIG. 1B, the base substrate 1 is removed from the flexible display device. In the process of removing the base substrate 1 from the related art flexible display device, a force supporting the flexible substrate 2 may be eliminated so that the flexible substrate 2 might be rolled in any one direction.

Accordingly, the flexible substrate 2 may be wrinkled, and other elements to be attached to the flexible substrate 2 may be unstably provided and thus separated from the flexible substrate 2.

SUMMARY

Accordingly, embodiments of the present invention are directed to a flexible display device that substantially obviates one or more problems due to limitations and disadvantages of the related art.

An aspect of the present invention is to provide a flexible display device which is capable of preventing a flexible substrate from being deformed when a base substrate is removed therefrom.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided a flexible display device that may include a flexible substrate; a display device layer on a first surface of the flexible substrate; a receiving groove in a second surface of the flexible substrate; and a deformation-preventing layer in the receiving groove on the second surface of the flexible substrate.

In another aspect of embodiments of the present invention, there is provided a method of manufacturing a flexible display device that may include forming a sacrifice layer on a base substrate; forming a deformation-preventing layer on the sacrifice layer; partially removing the sacrifice layer and the deformation-preventing layer from the base substrate; forming a flexible substrate on an upper surface of the remaining deformation-preventing layer and an upper surface of the base substrate from which the sacrifice layer and the deformation-preventing layer are removed; forming a display device layer on the flexible substrate; and removing the base substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate example embodiments of the invention and together with the description serve to explain the principle of embodiments of the invention. In the drawings.

DETAILED DESCRIPTION

Figure 1A:
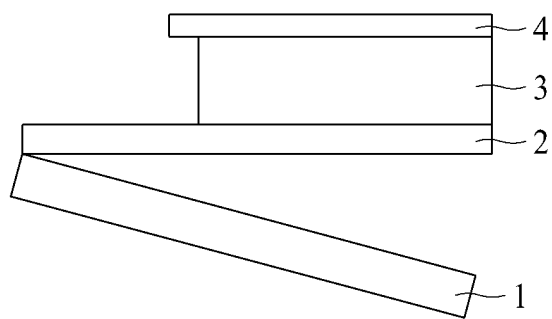
FIGS. 1A and 1B are cross sectional views illustrating a related art flexible display device.
Figure 1B:
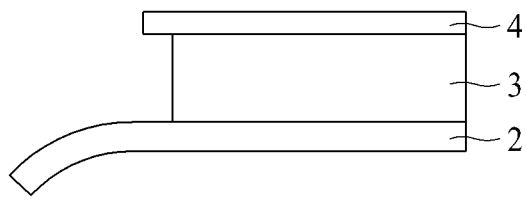

Reference will now be made in detail to embodiments of the present invention, examples of which are illustrated in the accompanying drawings. Where possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is defined by the scopes of the claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary. In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a flexible display device according to example embodiments of the present invention will be described with reference to the accompanying drawings.

Figure 2:
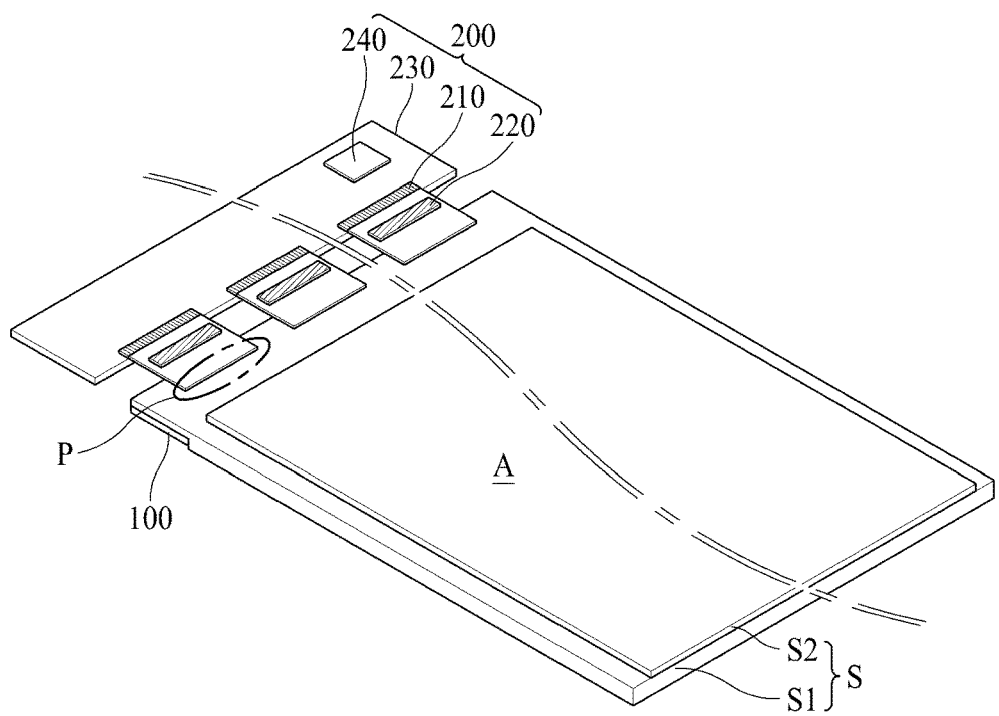
FIG. 2 is a perspective view illustrating a flexible display device according to an example embodiment of the present invention.
Figure 3:
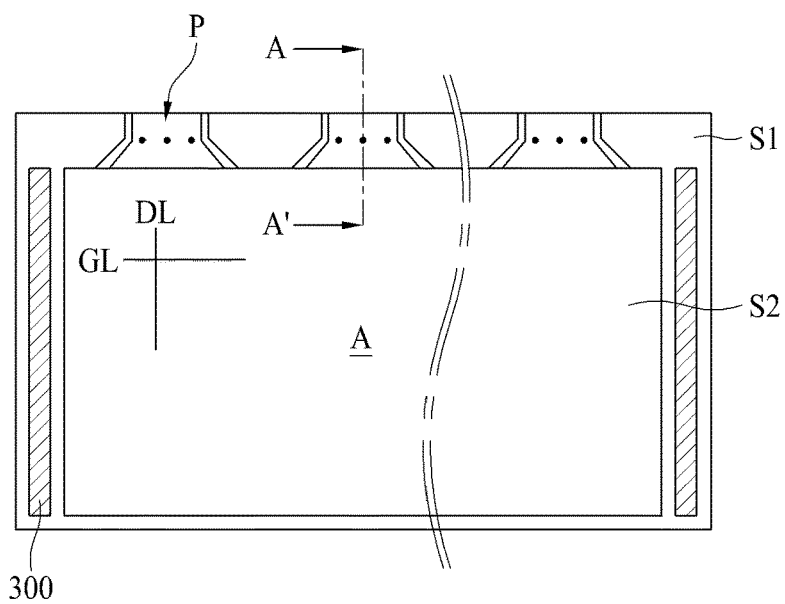
FIG. 3 is a plane view illustrating the flexible display device according to an example embodiment of the present invention.

FIG. 2 is a perspective view illustrating a flexible display device according to an example embodiment of the present invention. FIG. 3 is a plane view illustrating the flexible display device according to an example embodiment of the present invention.

As shown in FIGS. 2 and 3, the flexible display device according to an example embodiment of the present invention may include a lower substrate S1, an upper substrate S2, a pad portion P, a deformation-preventing layer 100, a panel driver 200, and a gate driving circuit 300.

The lower substrate S1 may include a display area A, and a non-display area provided in the periphery of the display area A. The display area A may correspond to an area except the edge of the lower substrate S1, and an image is displayed in the display area A. The display area A may include a plurality of pixels provided at every pixel region, the pixel regions defined by the crossings of a plurality of gate lines GL and a plurality of data lines DL. In this example, the display area A may correspond to a first area, and the non-display area may correspond to a second area. The first and second areas will be discussed in more detail later.

The upper substrate S2 against the display area A is bonded to the display area A.

The plurality of pad portions P are provided at fixed intervals on the non-display area of the lower substrate S1, wherein each pad portion P includes a data pad electrically connected with the plurality of data lines. Also, the pad portion P provided in the non-display area may overlap with the second area.

The deformation-preventing layer 100 is provided in the non-display area of a lower surface of the lower substrate S1. For example, a receiving groove is provided in a flexible substrate of the lower substrate S1, and the deformation-preventing layer 100 is provided in the receiving groove. Accordingly, a thickness of the flexible substrate corresponding to the display area A is larger than a thickness of the flexible substrate corresponding to the non-display area. In an example, the deformation-preventing layer 100 is formed in a straight-line structure parallel to a side of the lower substrate S1. However, the deformation-preventing layer 100 may be formed in any shape capable of being received in the receiving groove. Also, the deformation-preventing layer 100 may be formed of a material enabling a deformation-preventing function.

The lower substrate S1 may include the flexible substrate, and the flexible substrate may be a thin substrate of plastic. The flexible substrate may be too thin to bear a deposition process during manufacturing. Accordingly, after a base substrate is attached to one surface of the flexible substrate, a display device layer is formed on the other surface of the flexible substrate, and the upper substrate S2 is formed on the display device layer. The base substrate may be formed of a solid material capable of supporting the flexible substrate for the manufacturing process—for example, glass.

In the related art flexible display device, the base substrate is completely removed after a process of forming the upper substrate S2. In a process of removing the base substrate from the related art flexible display device, a force supporting the flexible substrate may be eliminated so that the flexible substrate might be rolled in any one direction, and the lower substrate S1 might be deformed. For example, the non-display area of the lower substrate S1 may be relatively thin so that the non-display area of the lower substrate S1 might be rolled in any one direction. Because the non-display area of the lower substrate S1 may be rolled in any one direction, the display area of the lower substrate S1 may be wrinkled entirely, and thus deformed.

In the flexible display device according to an example embodiment of the present invention, the deformation-preventing layer 100 is provided in the non-display area of the lower substrate S1, to thereby prevent the non-display area and the display area from being deformed. That is, the deformation-preventing layer 100, which may be formed of a relatively solid material, is provided in the non-display area of one surface of the lower substrate S1 so that it is possible to support the relatively thin flexible substrate, and also to prevent the lower substrate S1 of the non-display area from being rolled in any one direction. With regard to the lower substrate S1 on which the upper substrate S2 is not formed, the display area A of one surface of the lower substrate S1 is exposed, and one surface of the deformation-preventing layer 100 provided in the non-display area of one surface of the lower substrate S1 is exposed.

A total thickness obtained by adding a thickness of the flexible substrate corresponding to the non-display area and a thickness of the deformation-preventing layer 100 corresponding to the non-display area may be smaller than a thickness of the flexible substrate corresponding to the display area A. In the flexible display device according to an example embodiment of the present invention, even though the deformation-preventing layer 100 is provided in the non-display area of the lower substrate S1, a thickness of the lower substrate S may not be increased. Also, a small total thickness, obtained by adding the thickness of the flexible substrate corresponding to the non-display area and the thickness of the deformation-preventing layer 100 corresponding to the non-display area, enables realization of a flexible display device which is thinner than the related art flexible display device.

Figure 7:
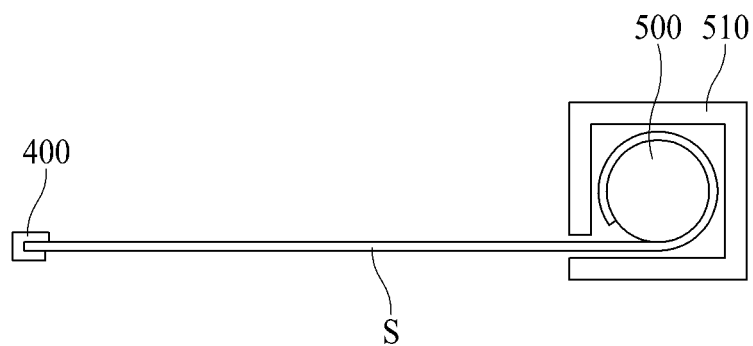
FIG. 7 is a cross sectional view illustrating a flexible display device according to an example embodiment of the present invention.

FIG. 2 shows that the deformation-preventing layer 100 is provided only in the lower surface of the pad portion P, but embodiments are not limited to this structure. For example, the deformation-preventing layer 100 may be provided in the lower surface of the lower substrate S1 with a lower surface of the gate driving circuit 300. However, if the flexible display device according to embodiments of the present invention is applied to a rollable display device, the deformation-preventing layer 100 may be provided in any one side of the non-display area of the lower substrate S1, and in example embodiments may be provided in the side with the pad portion P. As shown in the example of FIG. 7, because the rollable display device may be repetitively rolled or unrolled with respect to any one side corresponding to a central axis, the deformation-preventing layer 100 may be formed in the side corresponding to the central axis. Also, the deformation-preventing layer 100 may not be formed in another side that is brought into contact with the side corresponding to the central axis and that is vertical to the side corresponding to the central axis. For example, for an engaging portion 400 engaged with the pad portion P, it may be preferable that the deformation-preventing layer 100 is provided in the side provided with the pad portion P.

With reference again to the example of FIG. 2, the panel driver 200 may include a film package 210, a data driving chip 220, a printed circuit board 230, and a driving power generator 240.

The film package 210 is attached to each of the pad portions P provided in the lower substrate S1 while being connected with the data line DL. The film package 210 may be formed of Chip On Flexible Board or Chip On Film (COF) or Tape Carrier Package (TCP) with a plurality of input/output pads (I/O pads).

The data driving chip 220 is provided in each film package 210. The data driving chip 220 converts video data supplied from the input pad of the film package 210 into a data signal of an analog type, and supplies the data signal to the corresponding data line via the output pad of the film package 210.

The printed circuit board 230 is attached to the input pad of each of the plurality of film packages 210. The printed circuit board 230 supplies video data to the data driving chip 220, and also supplies driving power (for example, driving voltage, gamma voltage, ground power, etc.) and control signal(s) for displaying an image to the flexible substrate. To this end, on the printed circuit board 230, there is a timing controller (not shown) for generating the video data and control signal, and a driving power generator 240 for generating the driving power.

With reference to FIG. 3, the gate driving circuit 300 is provided in the non-display area, and is disposed close to any one side of the display area A, wherein the gate driving circuit 300 drives the gate line(s) GL. The gate driving circuit 300 may include a gate control signal line group (not shown) supplied with a plurality of gate control signals from the panel driver 200, and a plurality of stages (not shown) for generating a gate signal in accordance with the plurality of gate control signals and sequentially supplying the gate signal to the gate lines GL. In this example, the plurality of gate control signals may be a gate start pulse, a plurality of gate clock signals, etc. The gate driving circuit 300 generates the gate signal in accordance with a sequential driving of the stages, and sequentially supplies the gate signal to the plurality of gate lines GL.

Figure 4:
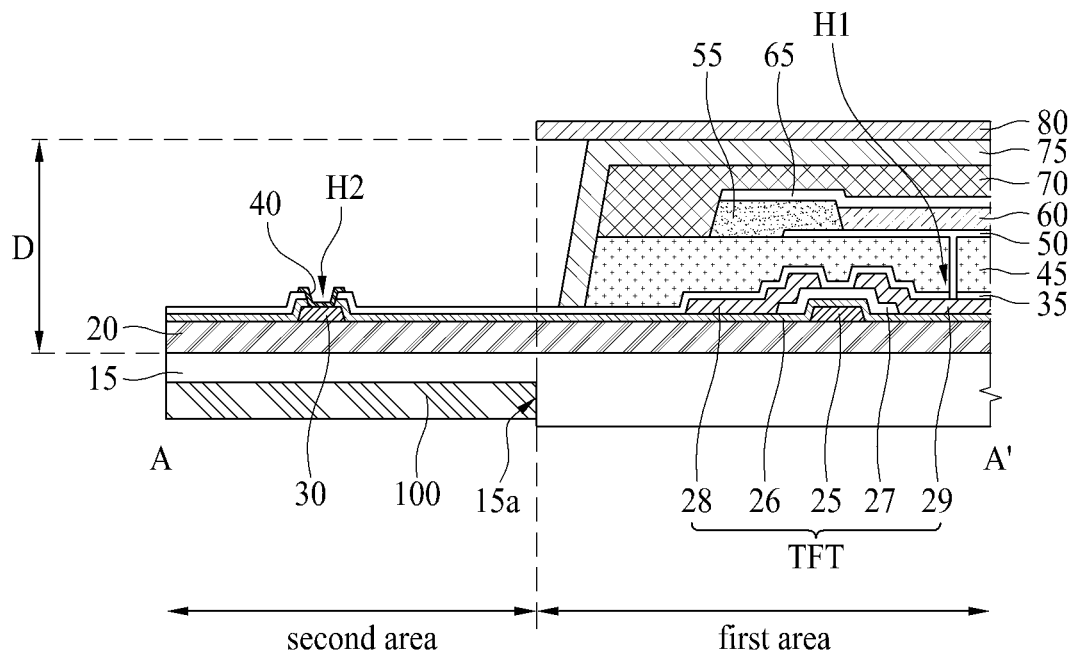
FIG. 4 is a cross sectional view illustrating a flexible display device according to an example embodiment of the present invention.

FIG. 4 is a cross sectional view illustrating a flexible display device according to an example embodiment of the present invention, which corresponds to a cross section along A-A' of FIG. 3.

As shown in FIG. 4, the flexible display device according to an example embodiment of the present invention may include a flexible substrate 15, a display device layer D provided on one surface of the flexible substrate 15, an encapsulation layer 80 provided on the display device layer D, and a deformation-preventing layer 100 provided on the other surface of the flexible substrate 15, that is, the opposite surface to one surface provided with the display device layer D.

The flexible substrate 15 may be formed of a thin substrate of plastic. For example, the flexible substrate 15 may include any one among polyethersulphone (PES), polyacrylate, (PAR), polyetherimide (PEI), polyethyelenen napthalate (PEN), polyethyelene terepthalte (PET), polyphenylene sulfide (PPS), polyallylate, polyimide, polycarbonate (PC), cellulose triacetate (TAC), and cellulose acetate propionate (CAP). If heat is applied to the flexible substrate 15, the flexible substrate 15 may shrink. Thus, for a manufacturing process, a base substrate of glass is attached fixedly to the other surface of the flexible substrate 15, that is, the opposite surface to one surface provided with the display device layer D. After completing the manufacturing process, the base substrate is removed from the flexible display device 15.

The display device layer D may include a first area with a relatively low level of thermal deformation, and a second area with a relatively high level of thermal deformation.

The first area may include a buffer layer 20, a thin film transistor TFT, a passivation layer 35, a first planarization layer 45, a first electrode 50, a bank layer 55, an organic light emitting layer 60, a second electrode 65, a second planarization layer 70, and an adhesive layer 75.

The buffer layer 20 is provided on the flexible substrate 15. The buffer layer 20 may be formed of one or more layers. If heat is applied to the buffer layer 20, the buffer layer 20 may be released.

The thin film transistor TFT is provided on the buffer layer 20. The thin film transistor TFT may include a gate electrode 25, a gate insulating layer 26, an active layer 27, a source electrode 28, and a drain electrode 29.

The gate electrode 25 is provided on the buffer layer 20. The gate insulating layer 26 is interposed between the gate electrode 25 and the active layer 27, and the gate electrode 25 is overlapped with the active layer 27. The gate electrode 25 may be formed in a single-layered structure or a multi-layered structure using any one of molybdenum (Mo), aluminum (Al), chrome (Cr), gold (Au), titanium (Ti), nickel (Ni), neodymium (Nd) and copper (Cu), or their alloys.

The gate insulating layer 26 is provided on the gate electrode 25. The gate electrode 25 and the active layer 27 are insulated from each other by the gate insulating layer 26. The gate insulating layer 26 may be formed of an inorganic insulating material such as silicon oxide or silicon nitride, but is not limited to these materials. The gate insulating layer 26 may be formed of an organic insulating material such as photoacryl or benzocyclobutene (BCB). If applying heat to the gate insulating layer 26, the gate insulating layer 26 may be released.

The active layer 27 is overlapped with the gate electrode 25, and provided on the gate insulating layer 26. The active layer 27 may be formed of a silicon-based semiconductor, or may be formed of an oxide semiconductor such as In—Ga—Zn—O (IGZO).

The source electrode 28 and the drain electrode 29 confronting each other are provided on the active layer 27, wherein the source electrode 28 is connected with one side of the active layer 27, and the drain electrode 29 is connected with the other side of the active layer 27. Each of the source electrode 28 and the drain electrode 29 may be formed in a single-layered structure or a multi-layered structure using any one of molybdenum (Mo), aluminum (Al), chrome (Cr), gold (Au), titanium (Ti), nickel (Ni), neodymium (Nd), and copper (Cu), or their alloys.

The aforementioned thin film transistor TFT may relate to a bottom gate structure, in which the gate electrode 25 is provided below the active layer 27. However, embodiments of the present invention may include a top gate structure, in which the gate electrode 25 is provided above the active layer 27.

The passivation layer 35 is provided on the thin film transistor TFT, thereby protecting the thin film transistor TFT. The passivation layer 35 may be formed of an inorganic insulating material, for example, silicon oxide (SiOX) or silicon nitride (SiNX). If applying heat to the passivation layer 35, the passivation layer 35 may be released.

The first planarization layer 45 is provided on the passivation layer 35, thereby planarizing an upper surface of the passivation layer 35. For example, the first planarization layer 45 may be formed of acryl resin, epoxy resin, phenolic resin, polyamide resin, polyimide resin, etc. If heat is applied to the first planarization layer 45, the first planarization layer 45 may shrink.

The aforementioned passivation layer 35 and first planarization layer 45 are provided with a first contact hole H1 for exposing the drain electrode 29. Through the first contact hole H1, the drain electrode 29 and the first electrode 50 are connected with each other.

The first electrode 50 is provided on the first planarization layer 45. The first electrode 50 is connected with the drain electrode 29 which is exposed through the first contact hole H1. The first electrode 50 may function as an anode electrode of the thin film transistor TFT.

The bank layer 55 is provided on the first electrode 50. The bank layer 55 may be formed of an organic film of polyimide resin, acryl resin, benzocyclobutene (BCB), etc. If heat is applied to the bank layer 55, the bank layer 55 may shrink.

The organic light emitting layer 60 is provided on the first electrode 50. The organic light emitting layer 60 may be formed in a combination structure of hole injection layer, hole transport layer, organic emission layer, electron transport layer, and electron injection layer, but is not limited to this example structure. A structure of the organic light emitting layer 60 may be changed to various structures generally known to those in the art.

The second electrode 65 is provided on the organic light emitting layer 60. If the first electrode 50 functions as the anode electrode, the second electrode 65 functions as a cathode electrode.

The second planarization layer 70 is provided on the first planarization layer 45 and the second electrode 65, thereby planarizing an upper surface of the second electrode 65, and protecting the thin film transistor TFT and the organic light emitting layer 60 from external moisture. If heat is applied to the second planarization layer 70, the second planarization layer 70 may shrink.

The adhesive layer 75 is provided on the second planarization layer 70. The second planarization layer 70 and the encapsulation layer 80 are adhered to each other by the adhesive layer 75.

Among the above elements of the first area, the buffer layer 20, the gate insulating layer 26, and the passivation layer 35 may include an inorganic insulating material. Generally, if heat is applied to the inorganic insulating material, the inorganic insulating material may be released. Among the above elements of the first area, the first and second planarization layers 45 and 70 and the bank layer 55 may mainly include an organic insulating material. Again, as noted, if heat is applied to the organic insulating material, the organic insulating material may shrink. Accordingly, the first area is provided with both the layer which is released by heat and the layer which shrinks by heat. Thus, if applying heat, the elements which shrink by heat and the elements which are released by heat are complementarily mixed together at similar percentages so that it is possible to prevent the flexible substrate 15 from being deformed without the base substrate.

The second area may include a buffer layer 20, a pad 30, a gate insulating layer 26, a passivation layer 35, and a pad electrode 40.

The buffer layer 20 is provided on the flexible substrate 15, and the pad 30 is provided on the buffer layer 20. The pad electrode 40 is connected with the pad 30 via a second contact hole H2.

The buffer layer 20, the gate insulating layer 26 and the passivation layer 35 extend from the first area. Thus, the same reference numbers refer to the same or like parts, and a detailed description for the same parts will be hereinafter omitted.

Among the above elements of the second area, the buffer layer 20, the gate insulating layer 26, and the passivation layer 35 are released by heat. However, there are no elements that shrink by heat in the second area. Thus, the second area is provided only with elements having constant deformation so that it is impossible to realize complementariness as discussed above. In this example, if the base substrate is removed from the second area, the flexible substrate 15 of the second area may be deformed.

Meanwhile, in the flexible display device according to an example embodiment of the present invention, the second area may not be provided with elements which shrink by heat, but embodiments are not limited thereto. Where the second area is provided with elements which shrink by heat, a percentage of the elements which shrink by heat may be lower than a percentage of the elements which are released by heat, which might cause deformation of the flexible substrate 15. That is, if the second area is mainly provided with any one of the kind of the elements which shrink by heat or the elements which are released by heat, the flexible substrate 15 might be deformed.

To overcome this problem relating to the deformation of the flexible substrate 15, a receiving groove 15a is provided in the flexible substrate 15, and the deformation-preventing layer 100 is formed in the receiving groove 15a. The deformation-preventing layer 100, which overlaps with the second area, enables support of the flexible substrate 15 corresponding to the second area. The deformation-preventing layer 100 may be formed of a relatively solid material, for example, glass, so that the flexible substrate 15 can be prevented from being bent (i.e., deformed).

Also, the deformation-preventing layer 100 may be formed of a structure in parallel to the side of the flexible substrate 15. Thus, the first area of the flexible substrate 15 is exposed. However, in the second area of the flexible substrate 15, one surface of the deformation-preventing layer 100 is exposed.

Also, a total thickness obtained by adding a thickness of the flexible substrate 15 corresponding to the second area and a thickness of the deformation-preventing layer 100 corresponding to the second area may be smaller than a thickness of the flexible substrate 15 corresponding to the first area. This will be discussed later with reference to a manufacturing process. In the flexible display device according to an example embodiment of the present invention, even though the deformation-preventing layer 100 is provided in the lower surface of the flexible substrate 15, a thickness of the flexible substrate 15 is not increased. Also, the small total thickness, which is obtained by adding the thickness of the flexible substrate corresponding to the second area and the thickness of the deformation-preventing layer 100 corresponding to the second area, enables realization of a thin flexible display device which is thinner than the related art flexible display device.

The encapsulation layer 80 is provided on the adhesive layer 75. The encapsulation layer 80 prevents permeation of the external moisture, thereby preventing degradation of the organic light emitting layer 60. The encapsulation layer 80 may be formed of metal, such as copper (Cu) and aluminum (Al) or their alloys. In an example, the encapsulation layer 80 is provided on an entire upper surface of the first area of the display device layer D, thereby supporting the flexible substrate 15 without using the base substrate. Because the flexible substrate 15 of the first area is supported by the encapsulation layer 80, the flexible substrate 15 can be prevented from being rolled to some degree.

Accordingly, the flexible substrate 15 of the flexible display device according to an example embodiment of the present invention is not rolled in any direction, owing to the encapsulation layer 80 provided in the first area and the deformation-preventing layer 100 provided in the second area, so that the flexible substrate 15 can be prevented from being entirely wrinkled, that is, deformed.

Figure 5:
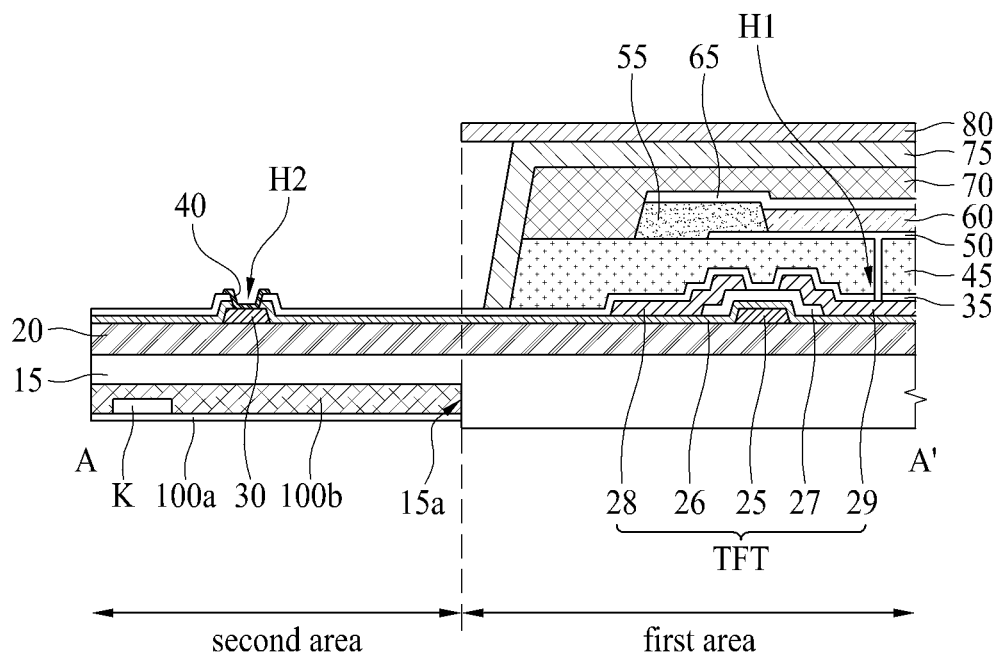
FIG. 5 is a cross sectional view illustrating a flexible display device according to an example embodiment of the present invention.

FIG. 5 is a cross sectional view illustrating a flexible display device according to an example embodiment of the present invention.

Except for deformation-preventing layer 100 and direction key 'K', the flexible display device of FIG. 5 may be identical to the aforementioned flexible display device of FIG. 4, whereby the same reference numbers refer to the same or like parts, and a detailed description for the same parts may be omitted.

In the example of FIG. 5, the deformation-preventing layer 100 may include a first deformation-preventing layer 100a and a second deformation-preventing layer 100b.

The second deformation-preventing layer 100b is provided on the first deformation-preventing layer 100a, and the direction key 'K' is provided between the first deformation-preventing layer 100a and the second deformation-preventing layer 100b.

The direction key 'K' may be formed of metal, and may serve as a reference point for another process. For example, when the flexible substrate 15 is stained with foreign matters, a repair process is carried out. For the repair process, the direction key 'K' is used to sense a position of the flexible substrate 15, so that foreign matters can be removed from the flexible substrate 15.

A flexible display device according to an example embodiment of the present invention may be obtained by applying the direction key 'K' to the flexible display device of FIG. 4. In this case, defective goods may be removed for the repair process, thereby improving yield.

FIGS. 6A to 6E are cross sectional views illustrating a method for manufacturing the flexible display device according to an example embodiment of the present invention, which relates to a method for manufacturing the flexible display device of FIG. 5. Thus, the same reference numbers will be used to refer to the same or like parts, and a detailed description for the same parts may be omitted.

Hereinafter, a method for manufacturing the flexible display device according to an example embodiment of the present invention will be described as follows.

Figure 6A:
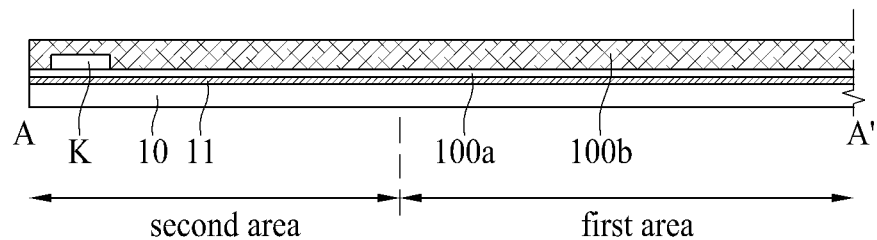
FIGS. 6A to 6E are cross sectional views illustrating a method for manufacturing the flexible display device according to an example embodiment of the present invention.

First, as shown in FIG. 6A, a sacrifice layer 11 is provided on the base substrate 10, the first deformation-preventing layer 100a is provided on the sacrifice layer 11, the direction key 'K', is provided on the first deformation-preventing layer 100a, and the second deformation-preventing layer 100b is provided on the direction key 'K'. The sacrifice layer 11 may be formed of a silicon oxide, such as amorphous silicon, or an insulating material, such as silicon nitride.

Figure 6B:
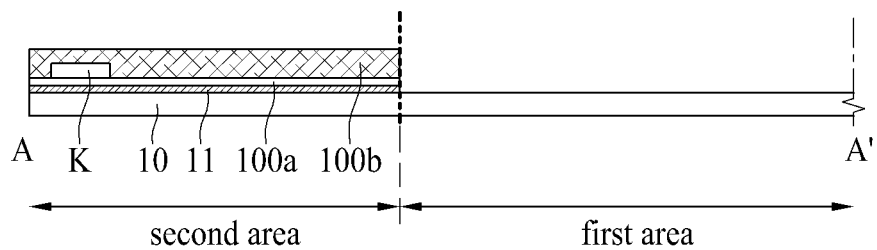

Then, as shown in FIG. 6B, the sacrifice layer 11, the first deformation-preventing layer 100a, and the second deformation-preventing layer 100b are removed from the first area. The sacrifice layer 11, the first deformation-preventing layer 100a, the direction key 'K' and the second deformation-preventing layer 100b provided in the second area remain therein.

Figure 6C:
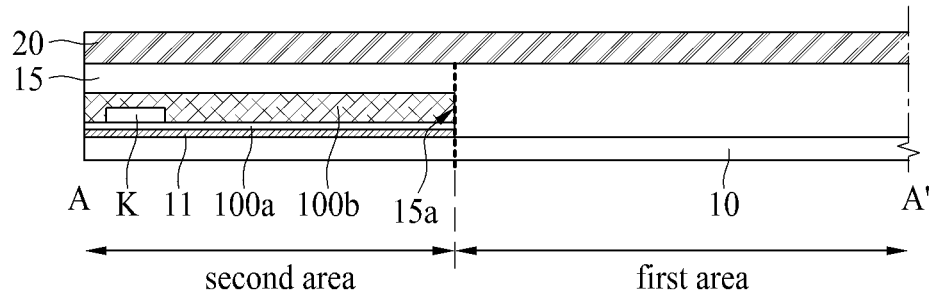

As shown in FIG. 6C, the flexible substrate 15 is formed on the base substrate 10 and the second deformation-preventing layer 100b. In more detail, the flexible substrate 15 is formed on the upper surface of the remaining first and second deformation-preventing layer 100a and 100b and the upper surface of the base substrate 10 from which the sacrifice layer 11 and the first and second deformation-preventing layers 100a and 100b are removed. Then, the buffer layer 20 is formed on the flexible substrate 15.

In this case, the upper surface of the flexible substrate 15 is planarized. Thus, the sacrifice layer 11, the first deformation-preventing layer 100a, and the second deformation-preventing layer 100b may be sequentially stacked in the receiving groove 15a; or the sacrifice layer 11, the first deformation-preventing layer 100a, the direction key 'K', and the second deformation-preventing layer 100b may be sequentially stacked in the receiving groove 15a. Accordingly, a total thickness of the flexible substrate 15, the sacrifice layer 11, the first deformation-preventing layer 100a, and the second deformation-preventing layer 100b corresponding to the second area, may be the same as a thickness of the flexible substrate 15 corresponding to the first area. Also, a total thickness of the flexible substrate 15, the sacrifice layer 11, the first deformation-preventing layer 100a, the direction key 'K', and the second deformation-preventing layer 100b corresponding to the second area, may be the same as a thickness of the flexible substrate 15 corresponding to the first area.

Figure 6D:
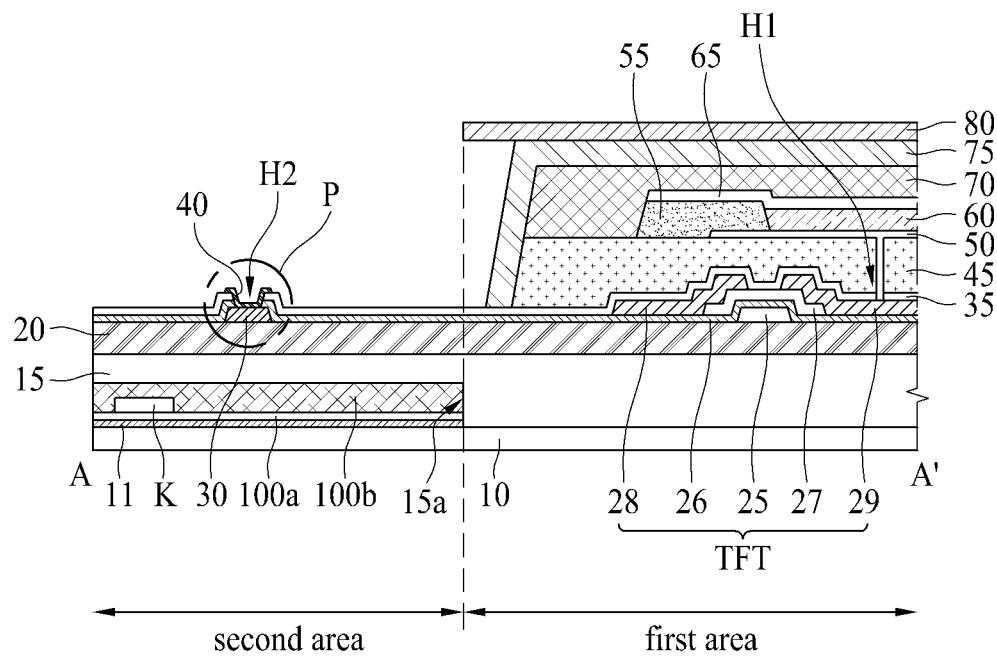

Then, as shown in FIG. 6D, the thin film transistor TFT is formed on the first area of the buffer layer 20, and the pad portion P is formed on the second area of the buffer layer 20. On the thin film transistor TFT, there are the passivation layer 35, the first planarization layer 45, the first electrode 50, the bank layer 55, the organic light emitting layer 60, the second electrode 65, the second planarization layer 70, and the adhesive layer 75.

A process of forming the thin film transistor TFT may include forming the gate insulating layer 26 on the buffer layer 20, forming the active layer 27 on the gate insulating layer 26, and forming the source and drain electrodes 28 and 29 on the active layer 27.

The process of forming the thin film transistor TFT may be carried out by various methods generally known to those in the art.

After forming the passivation layer 35 on the thin film transistor TFT, the first contact hole H1 for exposing the drain electrode 29 of the thin film transistor TFT is formed in the passivation layer 35 and the first planarization layer 45, and the first electrode 50 is formed to be connected with the drain electrode 29 via the first contact hole H1. Then, the bank layer 55 is formed at the side of the first electrode 50, and the organic light emitting layer 60 and the second electrode 65 are formed on the first electrode 50. The second planarization layer 70 is formed on the first planarization layer 45 and the second electrode 65, and the adhesive layer 75 is formed on the second planarization layer 70.

For the process of forming the gate electrode 25 of the thin film transistor TFT in the first area, the pad 30 is formed in the second area. For the process of forming the gate insulating layer 26 and the passivation layer 35 in the first area, the gate insulating layer 26 and the passivation layer 35 extend to the second area. The second contact hole H2 for exposing the pad 30 is formed, and the pad electrode 40 is formed on the pad 30.

Then, the encapsulation layer 80 is formed on the adhesive layer 75, and the base substrate 10 is removed. In this case, a method of removing the base substrate 10 corresponding to the first area may be different from a method of removing the base substrate 10 corresponding to the second area.

For example, the method of removing the base substrate 10 corresponding to the first area is carried out by irradiating the flexible substrate 15 with a laser from a lower side of the base substrate 10. When the flexible substrate 15 is irradiated with the laser, the interfacial surface between the flexible substrate 15 and the base substrate 10 may be burned so that the base substrate 10 and the flexible substrate 15 separate from each other.

Furthermore, the method of removing the base substrate 10 corresponding to the second area is carried out by separating the base substrate 10 and the sacrifice layer 11 from each other by irradiating the sacrifice layer 11 with a laser from a lower side of the base substrate 10. When the sacrifice layer 11 is irradiated with a laser, hydrogen distributed in the sacrifice layer 11 bursts and the sacrifice layer 11 disappears, whereby the base substrate 10 is separated, and thus only the first deformation-preventing layer 100a remains.

Figure 6E:
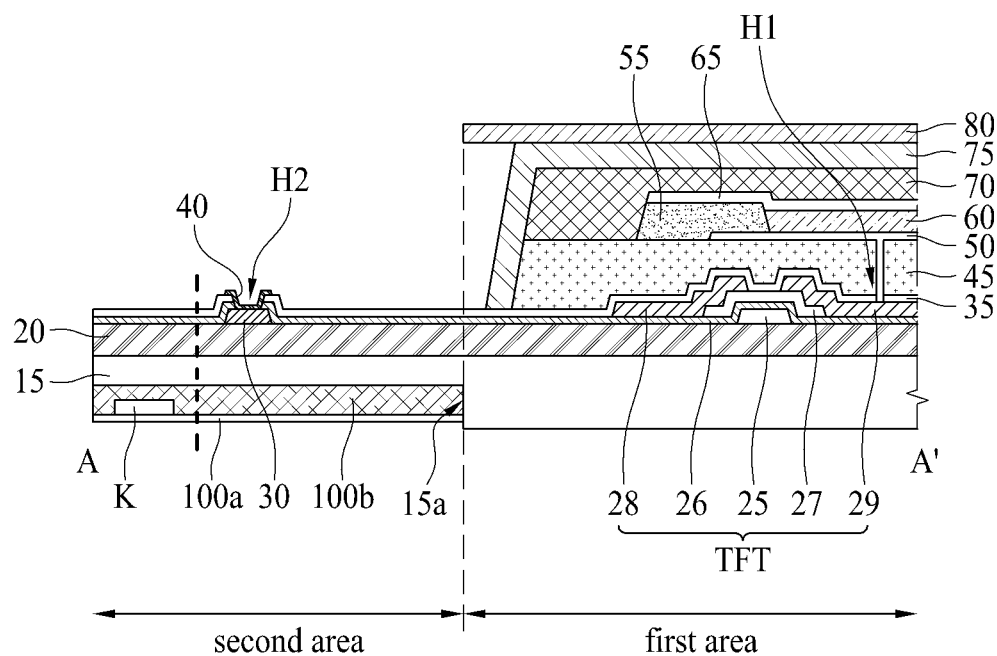

As shown by example in FIG. 6E, as the base substrate 10 and the flexible substrate 15 are separated from each other, only the first and second deformation-preventing layers 100a and 100b may remain in the lower surface of the flexible substrate 15.

Accordingly, a total thickness obtained by adding a thickness of the flexible substrate 15 corresponding to the second area and a thickness of the deformation-preventing layer 100 corresponding to the second area may be smaller than a thickness of the flexible substrate 15 corresponding to the first area. For example, the total thickness obtained by adding the thickness of the flexible substrate 15 corresponding to the second area and the thickness of the deformation-preventing layer 100 corresponding to the second area is smaller by a predetermined value equal to a thickness of the sacrifice layer 11. Thus, even though the deformation-preventing layer 100 is provided in the lower surface of the flexible substrate 15, a thickness of the flexible substrate 15 is not increased in the flexible display device according to the present invention. Also, the small total thickness, which is obtained by adding the thickness of the flexible substrate 15 corresponding to the second area and the thickness of the deformation-preventing layer 100 corresponding to second area, enables realization of a thin flexible display device that is thinner than the related art flexible display device.

FIG. 6E shows the direction key 'K'. However, it is possible to remove the direction key 'K' by a scribing process. In such an example, a structure of the flexible display device from which the direction key 'K' is removed may be the same as a structure of the flexible display device shown in FIG. 4.

FIG. 7 is a cross sectional view illustrating a flexible display device according to an example embodiment of the present invention.

In the flexible display device according to the example of FIG. 7, one side of the substrate S is connected with an engaging portion 400, and the other side of the substrate S is connected with a roller 500 while being provided in a shape to be rolled on the roller 500. A housing 510 is provided to surround the roller 500 with a predetermined space for the substrate S to be rolled on the roller 500.

The flexible display device of FIG. 7 includes the roller 500 provided at the other side of the substrate S which is not connected with the engaging portion 400, but embodiments are not limited thereto. The engaging portion 400 may be attached to the roller 500 while being provided in a shape to be rolled with the substrate S.

According to embodiments of the present invention, it may be possible to prevent the flexible display device from being deformed when the base substrate is removed therefrom. Also, it may be possible to improve the yield by preventing defective flexible display devices.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flexible display device, comprising:
a flexible substrate including a first portion corresponding to a display area and a second portion corresponding to a non-display area in a periphery of the display area;
a display device layer on a first surface of the first portion and the second portion of the flexible substrate, wherein the display device layer comprises a buffer layer provided on the first surface of the first portion and the second portion of the flexible substrate;
a receiving groove in a second surface of the second portion of the flexible substrate; and
a deformation-preventing layer in the receiving groove on the second surface of the second portion of the flexible substrate,
wherein the deformation-preventing layer is formed of a more rigid material than the flexible substrate,
wherein a thickness of the first portion is larger than a thickness of the second portion, and an end of the deformation-preventing layer faces an end of the first portion, and
wherein a thickness of an entire portion of the deformation-preventing layer is not larger than a depth of the receiving groove, and the deformation-preventing layer does not extend out of the receiving groove.

2. The flexible display device according to claim 1, wherein the display device layer includes a first area and a second area,
the first area has a lower level of thermal deformation than the second area, and
the deformation-preventing layer is overlapped with the second area.

3. The flexible display device according to claim 2, wherein:
the first area corresponds to an area with a layer which shrinks by heat and a layer which is released by heat, and
the second area corresponds to an area with a layer which shrinks by heat or a layer which is released by heat.

4. The flexible display device according to claim 2, wherein the first portion of the flexible substrate corresponds to the first area and the second portion of the flexible substrate corresponds to the second area.

5. The flexible display device according to claim 4, wherein a total thickness obtained by adding the thickness of the second portion of the flexible substrate and the thickness of the deformation-preventing layer corresponding to the second area is smaller than the thickness of the first portion of the flexible substrate.

6. The flexible display device according to claim 1, wherein the deformation-preventing layer includes a structure in parallel to a side of the flexible substrate.

7. The flexible display device according to claim 2, wherein the second surface of the flexible substrate is exposed in the first area, and a first surface of the deformation-preventing layer is exposed in the second area.

8. The flexible display device according to claim 2, wherein the first area corresponds to a display area, and the second area corresponds to a non-display area in the periphery of the display area.

9. The flexible display device according to claim 8, wherein the second area corresponds to an area overlapped with a pad portion in the non-display area.

10. The flexible display device according to claim 1, further comprising a roller at one side of the flexible substrate, wherein the flexible substrate is configured to be rolled on the roller.

11. The flexible display device according to claim 1, wherein:
the deformation-preventing layer includes a first deformation-preventing layer and a second deformation-preventing layer,
the second deformation-preventing layer is stacked on the first deformation-preventing layer, and
a direction key is between the first deformation-preventing layer and the second deformation-preventing layer.

12. The flexible display device according to claim 1, wherein the deformation-preventing layer is formed of glass, and the flexible substrate is formed of plastic.

* * * * *